United States Patent [19]

Esaki

[11] 4,198,644
[45] Apr. 15, 1980

[54] TUNNEL DIODE

[75] Inventor: Leo Esaki, Chappaqua, N.Y.

[73] Assignee: The United States of America as represented by the Secretary of the Army, Washington, D.C.

[21] Appl. No.: 914,103

[22] Filed: Jun. 9, 1978

[51] Int. Cl.² .................. H01L 29/88; H01L 29/161
[52] U.S. Cl. ...................................... 357/12; 357/16; 357/3; 357/61
[58] Field of Search .......................... 357/12, 16, 3, 61

[56] References Cited

U.S. PATENT DOCUMENTS

| | | | |
|---|---|---|---|
| 3,626,257 | 12/1971 | Esaki | 317/234 R |
| 3,626,328 | 12/1971 | Esaki | 331/107 G |
| 3,864,721 | 2/1975 | Cohen | 357/17 |
| 4,088,515 | 4/1975 | Blakeslee | 148/175 |
| 4,103,312 | 7/1978 | Esaki | 357/16 |
| 4,137,542 | 1/1979 | Esaki | 357/16 |

Primary Examiner—Martin H. Edlow
Attorney, Agent, or Firm—Nathan Edelberg; Sheldon Kanars; Jeremiah G. Murray

[57] ABSTRACT

A tunnel diode is disclosed which includes a heterostructure consisting of a first layer of $GaSb_{1-y}As_y$ and a second layer of $In_{1-x}Ga_xAs$. It is also disclosed that other alloys of Group III and Group V materials can be employed in a tunnel diode of the instant invention.

5 Claims, 4 Drawing Figures

TUNNEL DIODE

The invention described herein may be manufactured and used by or for the Government for governmental purposes without the payment of any royalties thereon or therefor.

FIELD OF INVENTION

This invention relates to semiconductor devices and particularly to tunnel diode semiconductor devices.

BACKGROUND OF THE INVENTION

The first tunnel diode was invented by the instant inventor over twenty years ago. Much study and work has gone into improving tunnel diodes but the basic structure has not been altered. The conventional tunnel diode includes a heavily doped p-type material and a heavily doped n-type material. Such heavy doping is required to permit tunneling in narrow junction widths. One result of the heavily doped material was a large number of dislocations in the crystalline structure resulting in high valley currents and attendant power dissipation. A second feature of highly doped tunnel diodes was a substantial tunneling width (length of path) which resulted in a relatively low tunneling current, limiting their high frequency performance.

BRIEF DESCRIPTION OF THE INVENTION

In accordance with the teachings of this invention, an improved tunnel diode is provided with a heterostructure comprising first and second layers of III-V compound semiconductor alloys wherein the first layer is an alloy including a first Group III material and a first Group V material, while the second layer is an alloy including a second Group III material different from the first Group III material and a second Group V material different from the first Group V material, and wherein the valance band of the first alloy is closer to the conduction band of the second alloy than it is to the valance band of the second alloy.

In the preferred embodiment of this invention, the first Group III material is In, the first Group V material is As, the second Group III material is Ga, and the second Group V material is Sb. A further feature of the preferred embodiment is that the first layer is an alloy of $GaSb_{1-y}As_y$ while the second layer is an alloy of $In_{1-x}Ga_xAs$ and y is equal to $0.918x + 0.082$.

DESCRIPTION OF THE DRAWINGS

For a more complete understanding of the invention, reference should be made to the following detailed description and drawings in which.

DETAILED DESCRIPTION OF THE INVENTION

Figure 1:
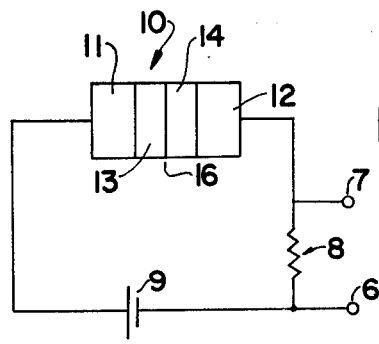
FIG. 1 is a schematic drawing showing a semiconductor device including a tunnel diode in accordance with the principles of this invention.

Referring now to FIG. 1 we see a semiconductor device 10 having a first and second ohmic contacts 11 and 12. Connected between the ohmic contacts are layers 13 and 14 which form a junction at their interface 16. A DC power supply 9 in series with a load resistor 8 is connected across semiconductor device 10. An output signal is provided between terminals 6 and 7.

Figure 3:
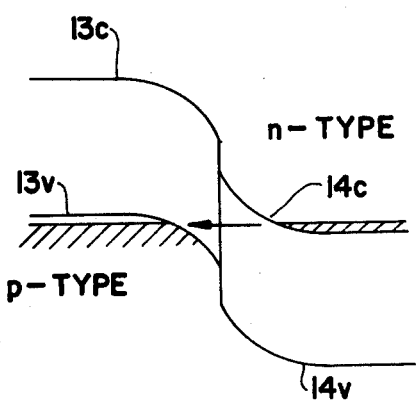
FIG. 3 is an energy level diagram of a tunnel diode constructed in accordance with the teachings of this invention.

The layer 13 is an alloy including a first Group III material and a first Group V material, while the layer 14 is an alloy including a second Group III material different from the first Group III material and a second Group V material different from the first Group V material. As shown in FIG. 3, the valance band 13V of the layer 13 is closer to the conduction band 14C of the layer 14 than it is to the valance band 14V of the layer 14. Also, as shown in FIG. 3 the layer 13 has been degenerately doped with an excess of acceptors to the extent that the Fermi level lies in the valance band. The layer 14 has been degenerately doped with an excess of donors to the extent that the Fermi level lies in the conduction band. When these layers are interfaced as a heterojunction diode, as shown in FIG. 3, the band edges beyond the junction region are such that the top of the valance band of layer 13 will be higher than the bottom of the conduction band of layer 14, thereby permitting tunnel diode action. In the preferred embodiment, the first Group III material is In, the first Group V material is As, the second Group III material is Ga, and the second Group V material is Sb.

In the preferred embodiment, the layer 13 is an alloy including InAs, and preferably an alloy of $In_{1-x}Ga_xAs$, while the layer 14 is an alloy including GaSb and, preferably an alloy of $GaSb_{1-y}As_y$.

The perameters y and x can be related in a preferred embodiment to obtain perfect lattice matching by the relationship:

$$y = 0.918x + 0.082$$

The device of FIG. 1 can be manufactured by molecular beam epitaxy. A system useful in growing an alloy semiconductor including the tunnel diode of this invention can be constructed similar to the system described for GaAs and AlAs, by L. L. Chang, L. Esaki, W. E. Howard, R. Ludeke and N. Schul in the Journal, J. Vac. Sci. Technol. 10, 655 (1973) with the exception of its having effusion cells containing elemental sources of the elements In, Ga, Sb and As, and of the dopent Sn. The substrates used include (100) oriented GaAs, InAs or GaSb. Chemically polished substrates should be degreased and etched prior to loading and subsequently Ar+ bombarded and annealed in an ambient of the corresponding group-V element in the molecular beam epitaxy system. The deposition temperature should be between 450° and 600° C., and the growth rate between one and three angstroms per second. The growth rate is determined by the arrival rates of the Group III elements. For a more complete discussion see "$In_{1-x}Ga_x$-As—$GaSb_{1-y}As_y$ Heterojunctions by Molecular Beam Epitaxy, by H. Sakaki, L. L. Chang, R. Ludeke, C. A. Chang, G. A. Sai-Halasz and L. Esaki; Appl. Phys. Lett. 31, 211 (1977), and MBE of InGaAs and GaSbAs, by C. A. Chang, R. Ludeke, L. Chang, and L. Esaki, Appl. Phys. Lett. 31, 759 (1977).

Figure 2:
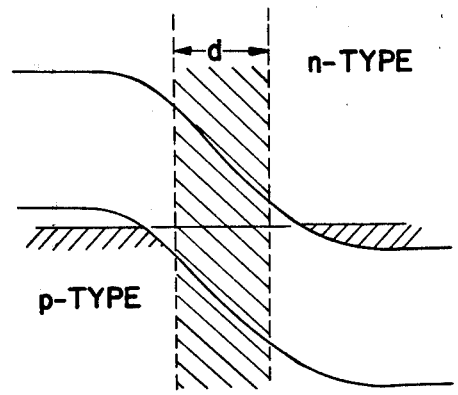
FIG. 2 is an energy level diagram of a conventional tunnel diode.
Figure 4:
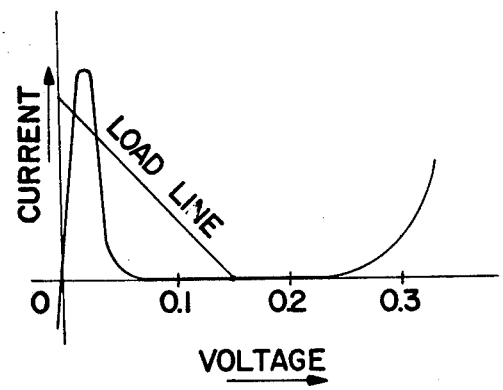
FIG. 4 is a voltage vs. current diagram of the tunnel diode of FIG. 1.

A comparison of FIG. 2 to FIG. 3 will show that the energy level diagram of FIG. 3 (of the tunnel diode of this invention) closely resembles the energy diagram of known tunnel diodes produced by heavy doping. It is noted that the differences between FIG. 2 and FIG. 3 can be viewed as though the shaded portion indicated as d in FIG. 2 has been removed and the remaining portions have been brought closer together. This results in a shorter tunneling path and therefore higher current in the structure of the present invention. A further advantage of the present invention is improved crystallinity resulting from the lower doping which produces a lower valley current than in conventional tunnel diodes. The net effect is a tunnel diode having a characteristic such as shown in FIG. 4 wherein the peak current is enhanced and the valley current is substantially reduced from conventional tunnel diodes providing better high frequency performance.

While this invention has been described with respect to particular embodiments thereof, numerous others will become obvious to those of ordinary skill in the art in light hereof.

What is claimed is:

1. A tunnel diode comprising: first and second layers of different semiconductor materials; the top of the valance band for the material of said first layer being at an energy between the energy of the bottom of the conduction band and the top of the valance band for the material of said second layer; the bottom of the conduction band for the material of said first layer being at an energy greater than the energy of the bottom of the conduction band for the material of said second layer; said first layer being degenerately doped with an excess of acceptors to the extent that the Fermi level lies in the valance band; said second layer being degenerately doped with an excess of donors to the extent that the Fermi level lies in the conduction band; and said first and second layers being interfaced to form a semiconductor heterojunction.

2. A tunnel diode according to claim 1, wherein the top of the valance band of said first layer is closer to the bottom of the conduction band of said second layer than it is to the top of the valance band of said second layer.

3. A tunnel diode as defined in claim 1, in which said layers are formed from different Group III-V alloys.

4. A tunnel diode as defined in claim 2, in which the first layer is an alloy of $In_{1-x}Ga_xAs$ and the second layer is an alloy of $GaSb_{1-y}As_y$.

5. A tunnel diode as defined in claim 4, in which $y = 0.918x + 0.082$.

* * * * *